United States Patent
Lenz et al.

[11] Patent Number: 6,025,720
[45] Date of Patent: Feb. 15, 2000

[54] GRADIENT AMPLIFIER AND MAGNETIC RESONANCE TOMOGRAPHY APPARATUS EMPLOYING SAME

[75] Inventors: Helmut Lenz, Oberasbach; Harald Hofmann, Forchheim, both of Germany

[73] Assignee: Siemens Aktiengesellschaft, Munich, Germany

[21] Appl. No.: 09/024,270

[22] Filed: Feb. 17, 1998

[30] Foreign Application Priority Data

Feb. 20, 1997 [DE] Germany .................. 197 06 756

[51] Int. Cl.$^7$ .................................................. G01V 3/00
[52] U.S. Cl. .......................................... 324/322; 324/318
[58] Field of Search ................................ 324/322, 318, 324/309, 307, 314, 312, 300; 600/421, 422, 410

[56] References Cited

U.S. PATENT DOCUMENTS

| | | | |
|---|---|---|---|
| 5,066,914 | 11/1991 | Vavrek et al. | 324/309 |
| 5,227,728 | 7/1993 | Kaufman et al. | 324/322 |
| 5,237,277 | 8/1993 | Lenz | 324/322 |
| 5,270,657 | 12/1993 | Wirth et al. | 324/322 |
| 5,442,290 | 8/1995 | Crooks | 324/309 |

*Primary Examiner*—Louis Arana
*Attorney, Agent, or Firm*—Hill & Simpson

[57] ABSTRACT

A gradient amplifier for a nuclear magnetic resonance tomography apparatus has at least one control arrangement with a comparator and a controller and a control input for a digital control word, by means of which a current transmission function of the control arrangement can be selected from several predetermined transmission functions. A nuclear magnetic resonance tomography apparatus includes such a gradient amplifier, as well as a control word producing source for producing the digital control words. The gradient amplifier and the tomography apparatus can easily be adjusted to different controller characteristics, without the changeover requiring a manual calibration.

20 Claims, 5 Drawing Sheets

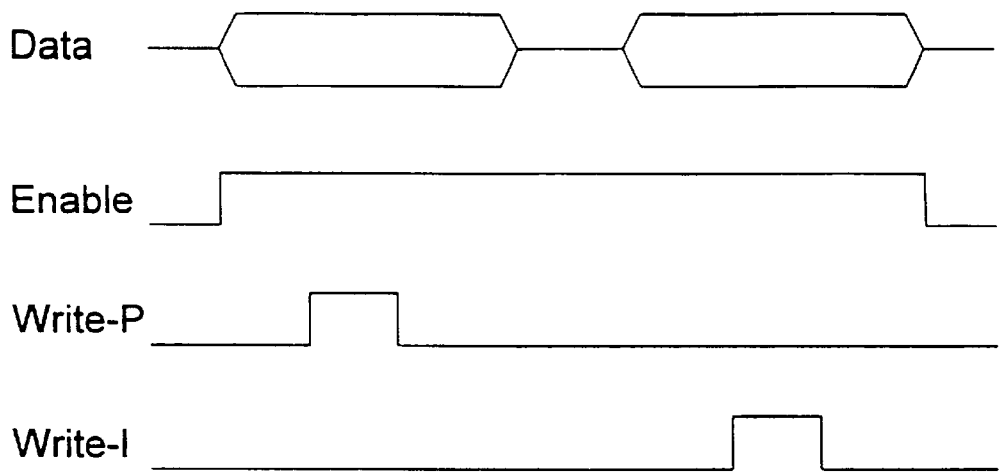
FIG. 8
FIG. 9
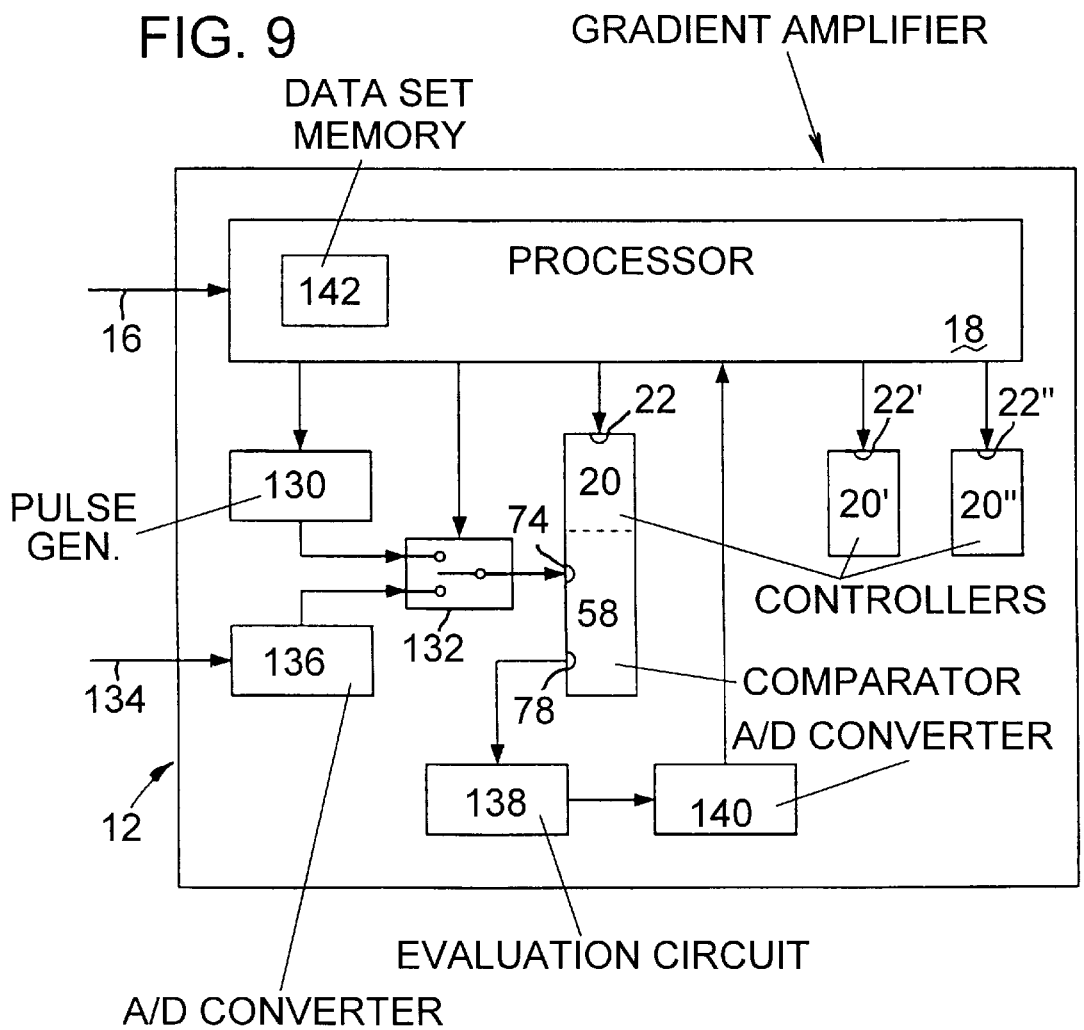

GRADIENT AMPLIFIER AND MAGNETIC RESONANCE TOMOGRAPHY APPARATUS EMPLOYING SAME

BACKGROUND OF THE INVENTION

1. Field of the Invention

The present invention is directed to a gradient amplifier for use in a magnetic resonance tomography (imaging) apparatus, the gradient amplifier being of the type having at least one control arrangement including a comparator which generates an error signal, and a controller which responds to the error signal to produce a manipulated variable signal, used to operate a gradient coil. The invention is also directed to a magnetic resonance tomography apparatus employing such a gradient amplifier.

2. Description of the Prior Art

Generally, known nuclear magnetic resonance tomography systems have three gradient coils in order to produce linear magnetic field gradients in the x, y and z directions. A precisely controlled current, produced by a gradient amplifier, flows through each of these coils. Each gradient amplifier, for example, sets the current precisely, to within a few mA, in a range between 0 and 300 A. In addition, a rate of rise of the current of about $3 \cdot 10^5$ A/s is required, for which purpose a voltage of about ±300 V must be applied to the coil.

The gradient amplifier contains a current controller for each gradient coil. The characteristics of the controller must be matched to the connected gradient coil. Due to the high precision required, in known tomography systems an expensive calibration by a trained service technician is necessary. For each controller, several potentiometers have to be set by hand. A controller of this sort is known for example from German OS 40 20 213.

SUMMARY OF THE INVENTION

An object of the present invention is to provide a gradient amplifier for a nuclear magnetic resonance tomography apparatus in which the expense connected with the calibration of the controller setting is reduced at least during operation, and preferably also during manufacture, installation and maintenance. In addition, an object of the invention is to provide a nuclear magnetic resonance tomography apparatus in which such a gradient amplifier is used as effectively as possible.

The above object is achieved in accordance with the principles of the present invention in a gradient amplifier and in a magnetic resonance tomography apparatus, wherein the gradient amplifier has at least one control arrangement including a comparator, which generates an error signal, and a controller which is responsive to the error signal in order to generate a manipulated variable signal which is supplied for operating a gradient coil, the control arrangement also including a control input for receiving a digital control word, the digital control word causing a current transmission function of the control arrangement to be selected from among a number of transmission functions. Each transmission function effects a different setting of switches and/or potentiometers of apparatus components. The transmission functions can include a few transmission functions which, once selected, cause the settings to be iteratively selected, or a larger number of finely-graduated predetermined transfer functions can be employed. The power amplifier is supplied with a digital control word, the selection of the transmission functions taking place dependent on the content of the digital control word. A transmission function, or an optimized, iteratively-obtained transmission function, is thereby achieved for matching the controller to the connected gradient coil, with little or no manual calibration being necessary.

The "control word," is a data word is thereby designated that is one or several bits wide. An "input" for such a control word is formed by one or several lines via which the control word can be transmitted in parallel fashion, serially, or in mixed forms.

By means of the inventive solution, the gradient amplifier can be easily adjusted to different control characteristics, without necessitating a calibration by hand during the changeover. The inventive gradient amplifier can be used in particular for tomography apparatuses that have several operating modes, in which different settings of the control apparatus are required. These are, for example, tomography apparatuses in the development phase, having several sets of different gradient coils, such as whole-body gradient coils and head gradient coils, between which changeovers can take place.

The transmission function of the control arrangement is determined by the controller and by the other assemblies of the control arrangement (e.g. the comparator). Preferably, the characteristics of the other assemblies are fixedly predetermined, and only the transmission function of the controller can be adjusted by means of the digital control word. In addition, or as an alternative, it is possible to use a comparator with an adjustable gain factor, or adjustable amplifiers can be provided at the inputs of the comparator. The control word can contain components for adjusting the controller and components for adjusting the other assemblies.

In a particularly simple embodiment of the gradient amplifier, the controller can be switched only between relatively few transmission functions, each of which being provided for a possible operating mode (e.g. for a determined gradient coil). For this purpose, several sets of adjustment potentiometers can be provided with suitable switching elements (e.g. relays). By means of the digital control word, precisely one of these sets is selected.

In this embodiment, in normal operation of the tomography apparatus no control adjustment is required. This is a considerable advantage, since a tomography apparatus with several operating modes become usable in practice only by this measure. A very high calibration expense, however, is associated with the first setting into operation of such a tomography apparatus, and this expense increases with the number of operating modes (e.g., the number of different coils).

Thus, in a further embodiment of the invention, a number of predetermined transmission functions are provided, of which only some (i.e., one for each operating mode) are used in practical operation. Preferably, the predetermined transmission functions are so finely-graduated that the overall calibration of the control arrangement is limited to the allocation of one transmission function for each operating mode. The calibration can then be carried out under partial or complete computer control, without requiring a manual setting of potentiometers. Due to the savings in labor, a computer-controlled calibration of this sort is advantageous even in a tomography apparatus having only a single operating mode.

If the number of predetermined transmission functions is very high, the transmission functions are preferably coded as respective combinations of binary numbers in the control word, or as individual components of the control word. For example, a control word can comprise 14 bits (structured into 2 components for each 7 bits, by means of which independent portions of the transmission function are determined). One of $2^{14}$=16,384 transmission characteristics can thus be selected.

Preferably, the controller is fashioned as a PI controller or as a PID controller, and includes a digitally adjustable amplifier for each controller branch, whose gain factor is determined by a component (one or several bits) of the control word. The control word is preferably transmitted from a central installation control to the gradient amplifier via a communication connection, and is there applied to the control input of the addressed controller.

In the nuclear magnetic resonance tomograph according to the invention, a control word producing source for producing a digital control word is provided, the digital control word being supplied to the at least one controller of the gradient amplifier. The controller can thereby be adjusted to different gradient coils rapidly and without expense.

Preferably, the control word production source is constructed so as to be allocated either to the gradient amplifier or to a central apparatus control. In the simplest case, the type of gradient coil connected is entered manually; however, preferably an automatic sampling takes place that determines the coil type independently and supplies outputs corresponding information to the control word producing source.

In preferred embodiments, a calibration unit is additionally provided, which can be constructed so as to be allocated either to the gradient amplifier or to the central apparatus control. Dependent on the characteristics of a connected gradient coil, the calibration unit enables the selection of a transmission function of the controller that has those predetermined characteristics. This preferably takes place dependent on at least one answer-back signal, e.g. a target value signal and/or an actual value signal and/or a controller signal and/or an error signal.

Preferably, the calibration unit includes, independent of the assemblies to which it is allocated, a processing stage and/or a conversion assembly and/or a pulse generator and/or an evaluation circuit. As the processing stage, a processor of the gradient amplifier, or of the central apparatus control, is preferably used.

In order to determine the desired transmission function, the characteristics of individual branches of the controller are preferably approximated step-by-step successively (iteratively) to a desired characteristic of the answer-back signal.

DESCRIPTION OF THE DRAWINGS

FIG. 8 shows timing diagrams for the transmission of a control word in accordance with the principles of the present invention.

FIG. 9 is a block diagram of a further embodiment of a gradient amplifier in accordance with the principles of the present invention.

DESCRIPTION OF THE PREFERRED EMBODIMENTS

Figure 1:
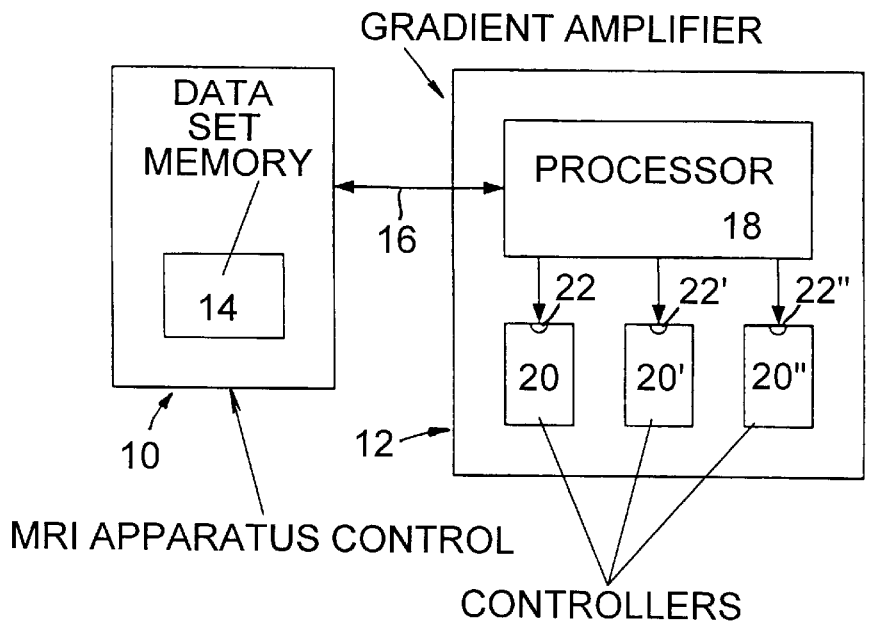
FIG. 1 is a block diagram of a magnetic resonance tomography apparatus constructed in accordance with the principles of the present invention.

In FIG. 1, of the various components of a nuclear magnetic resonance tomography apparatus are shown, which induce an apparatus control 10 and a gradient amplifier 12 are shown. The apparatus control 10 contains a data set memory 14, which enables recording of several data sets with three digital control words each and with additional items of information. The data set memory 14 can be read from and written into by the apparatus control 10. Via a communication connection 16, various commands and data can be exchanged between the apparatus control 10, a processor 18 of the gradient amplifier 12, and additional components (not shown in FIG. 1) of the tomography apparatus.

The gradient amplifier 12 contains, in a known manner, a number of components, in particular three controlled power amplifiers, each with a comparator, a controller, a pulse width modulator and a clocked switched output stage. Each power amplifier supplies a precisely controlled current to an exchangeable gradient coil. Of these components, only the three controllers 20, 20', 20" are shown in FIG. 1. The controllers 20, 20', 20" each comprise one control input 22, 22', 22" that is connected to the processor 18, and via which the corresponding controller 20, 20', 20" receives digital control words from the processor 18 for the setting of the controller characteristic. The construction of the controllers 20, 20', 20" is specified below on the basis of FIG. 6.

When the tomography apparatus is placed into operation for the first time, a service technician determines a suitable controller setting for each gradient coil in the form of a digital control word. These control words are stored as control data sets in the non-volatile data set memory 14 of the apparatus control 10, together with additional items of information if warranted.

If during normal operation of the tomography apparatus a controller adjustment is required, the apparatus control 10 reads the corresponding control data sets from the data set memory 14 and transmits the relevant content thereof, in particular the control word, to the processor 18 via the communication connection 16 in the form of a controller setting command. The processor 18 extracts the digital control word from the controller setting command, allocates and addresses it to one of the controllers 20, 20', 20", and sends it to the corresponding control input 22, 22', 22". A controller adjustment of this sort is, for example, required after each activation of the tomography apparatus or after a change of the gradient coils.

In one version, the apparatus control 10 is connected, via three sampling connections 24, 24', 24", to a respective sampling units 26, 26', 26". Each sampling unit 26, 26', 26" recognizes the type of a gradient coil allocated to it, and transmits a corresponding signal to the apparatus control 10. Given pluggable gradient coils, the sampling unit 26, 26', 26" can, for example, be fashioned as contacts of a coded plug, and, given gradient coils that can be switched over, can be fashioned as signaling contacts of mechanical changeover switches. By means of the evaluation of the signals of the sampling units 26, 26', 26", the apparatus control 10 can independently recognize a change of the gradient coils and the type of the coils now connected. The controllers 20, 20', 20" can then be reset in the way described above, even without an express command from the user.

Figure 2:
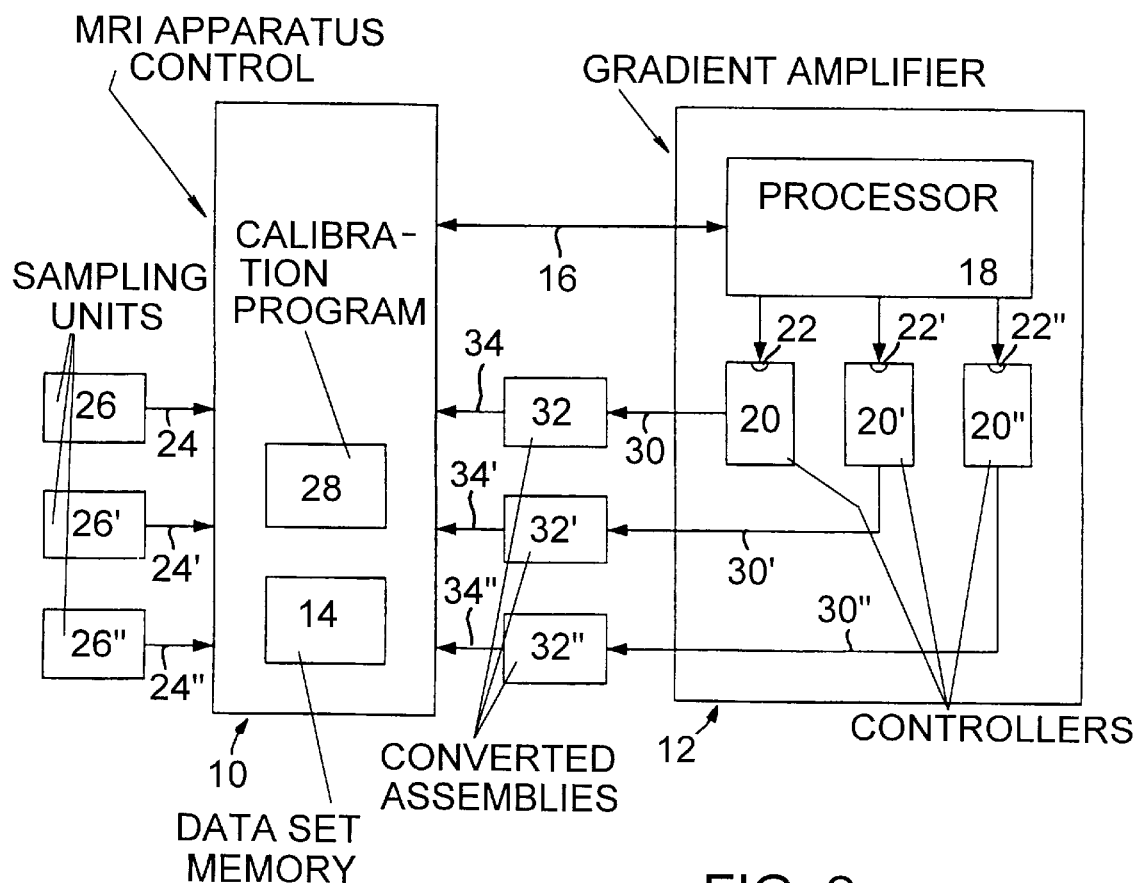
FIG. 2 is a schematic block diagram of an embodiment of a magnetic resonance tomography apparatus which the inventors currently consider as representing the best mode of the invention.

In a second version, in the exemplary embodiment shown in FIG. 2 a suitable controller setting is determined independently for each gradient coil, without requiring a troublesome measurement of this setting by a service technician.

In order to effect this type of setting, the apparatus control 10 includes a calibration program 28 for controlling the calibration process. For each controller 20, 20', 20", an answer-back connection 30, 30', 30" is provided. In the exemplary embodiment specified here, the answer-back connections 30, 30', 30" each contain four lines for respectively-carrying signals that identify the control characteristics of the corresponding controller 20, 20', 20". The answer-back signals are picked off at the controller 20, 20', 20", as well as at the allocated comparator (not shown in FIG. 2). For each controller 20, 20', 20", the answer-back signals represent a target current value, an actual current value, a manipulated variable and an error signal. In alternative embodiments, other signals can be provided as answer-back signals, or a different number of answer-back signals can be provided.

Three converter assemblies 32, 32', 32" each having four analog-digital converters for the respective answer-back signals, and are respectively connected to answer-back connections 30, 30', 30". Alternatively, a converter assembly with at least one ADC can be used in combination with multiplexers for selecting the answer-back signal. The digitized answer-back signals produced by the converter assemblies 32, 32', 32" are supplied to the apparatus control 10 via digital connections 34, 34', 34", and are evaluated therein. In a first embodiment, the converter assemblies 32, 32' and 32" are structurally allocated to the apparatus control 10, and in a second alternative embodiment they are structurally allocated to the gradient amplifier 12.

Figure 3:
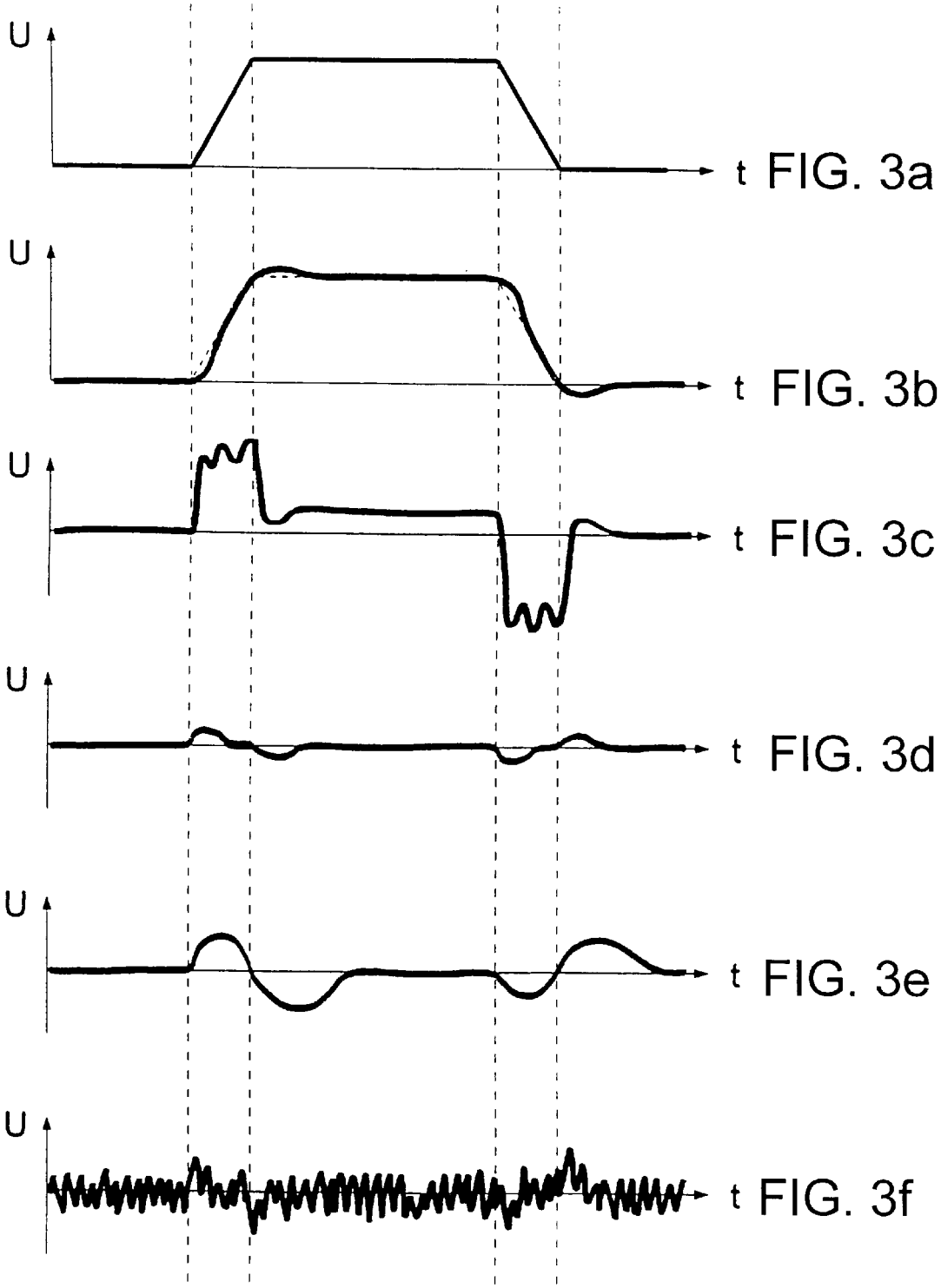
FIGS. 3a–3f respectively show voltage/time diagrams of control signals for explaining the operation of the inventive tomography apparatus.

In FIGS. 3a–3f, examples of the answer-back signals are individually shown. FIG. 3a shows an example of the target current value signal (i.e., a voltage signal that is proportional to the target value of the current flowing through the gradient coil), as it occurs during the normal operation of the tomograph. The actual current value signal shown in FIG. 3b can, for example, be picked off at a shunt resistor connected in series with the gradient coil. FIG. 3c shows an example of the manipulated variable (controller signal), i.e. the output of the controller 20, 20', 20", with which the pulse width modulator of the power amplifier is driven for the voltage supply of the gradient coil. FIG. 3d is an example of the error signal for the exemplary target value signal, or the exemplary actual value signal shown in FIGS. 3a and 3b, i.e., the difference signal thereof. A corresponding error signal for a controller 20, 20', 20" set too slow is shown in FIG. 3e, and a signal for an oscillating controller 20, 20', 20" that is set too "sharp" is shown in FIG. 3f.

For the automatic calibration of the control arrangement, in the exemplary embodiment described herein only the controllers 20, 20', 20" are adjusted, since the control arrangement otherwise comprise no adjustable components. For this purpose, the apparatus control 10 that executes the calibration program 28 first predetermines a series of different test settings (test data sets) for the controllers 20, 20', 20". The test settings are transmitted in the way described above to the controllers 20, 20', 20" via the communication connection 16 and the processor 18, as controller setting commands. For each test setting, the apparatus control 10 further produces a test sequence with different target value signals, and likewise feeds these into the gradient amplifier 12 via the communication connection 16 or via a separate connection (not shown in FIG. 2). The target value signals of a test sequence have different pulse shapes and amplitude values.

As described above, the answer-back signals picked off during the execution of each test sequence are digitized by the converter assemblies 32, 32', 32" and are supplied to the apparatus control 10. The apparatus control 10 evaluates the digitized signals in real time, and determines therefrom the optimal controller data for the respective gradient coil, which data are stored in the data set memory 14 as the data set allocated to this coil. If required, in order to determine the optimal controller data further test sequences can be executed that are based on the best controller settings found up to that time, and that enable a measurement in increasingly finer gradations. An example of a suitable calibration method is specified in more detail below with reference to FIG. 9.

The calibration program 28 can carry out the optimization with different target settings. For example, an optimal controller setting can be defined in that the error signal is very small (FIG. 3d), but the controller setting is still removed by a "safety margin" from the setting at which the controller 20, 20', 20" begins to oscillate (FIG. 3f). As an alternative, a controller setting can be sought at which the actual current value (FIG. 3b) agrees as precisely as possible with a current curve predetermined for all devices of a production series. Such a predetermined current curve does not correspond precisely to the actual current value, but rather represents standardized controller characteristics that can be achieved independently of component variations of all devices of a production series.

Figure 4:
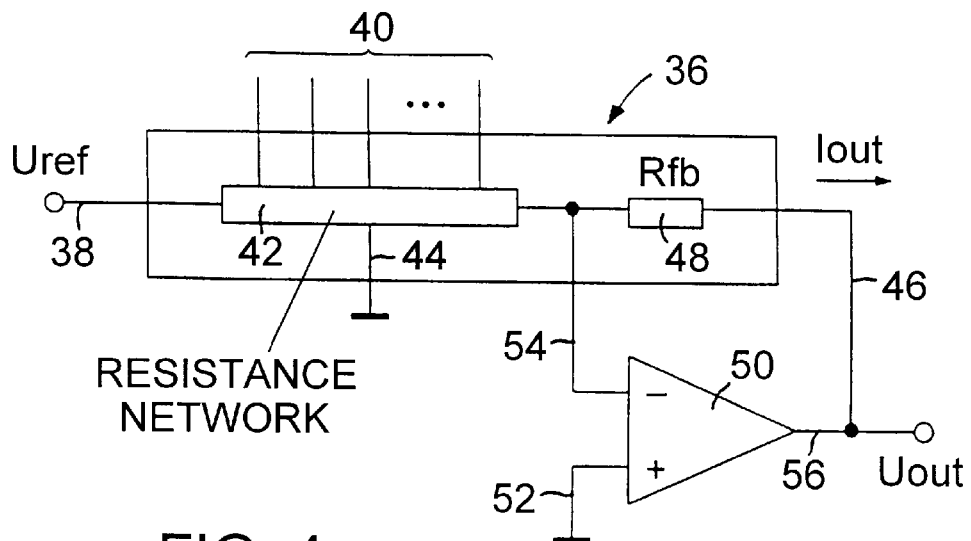
FIG. 4 is a block diagram of a first embodiment of an amplifier with a digitally adjustable gain factor, suitable for use in the tomography apparatus of the invention.

FIG. 4 shows a circuit of a known amplifier with a digitally adjustable gain factor. A digital-to-analog converter 36 is fashioned as a 12-bit converter for a multiplying operation without an internal reference voltage. A converter in CMOS technology known under the type designation AD 7945 is, for example, suitable. The digital-to-analog converter 36 has a terminal 38 for a reference voltage $U_{ref}$ and a twelve-bit-wide digital input 40 that is connected to an internal resistance network 42.

The resistance network 42 divides a current flow produced by the reference voltage $U_{ref}$ at the terminal 38 into two parts according to the occupation of the digital input 40, these parts respectively flowing to a ground terminal 44 and to a terminal 46 that is connected with the resistance network 42 by a resistor 48. The current $I_{out}$ flowing through the resistor 48 and via the terminal 46 is at a maximum (and the current to ground is at a minimum) when all bits of the digital input 40 are at logic "1." Conversely, no current $I_{out}$ flows when all bits of the digital input 40 have the logic value An operational amplifier 50 is connected to ground with its non-inverting input 52, to the connection between the resistance network 42 and the resistor 48 with its inverting input 54, and to the other terminal 46 of the resistor 48 with its amplifier output 56. The voltage $U_{out}$ at the amplifier output 56 is determined according to the formula $U_{out}=(-1) \cdot R_{fb} \cdot I_{out}$, whereby $R_{fb}$ is the value of the resistor 48. The value $I_{out}$ is proportional to the reference voltage $U_{ref}$, and to the data at the digital input 40. Given constant data, $U_{out}$ is thus proportional to $U_{ref}$. The proportionality factor (i.e., the gain factor of the circuit shown in FIG. 4) depends on the data word, and is between 0 (all bits of the digital input 40 at "0") and −1 (all bits of the digital input 40 at "1").

Figure 5:
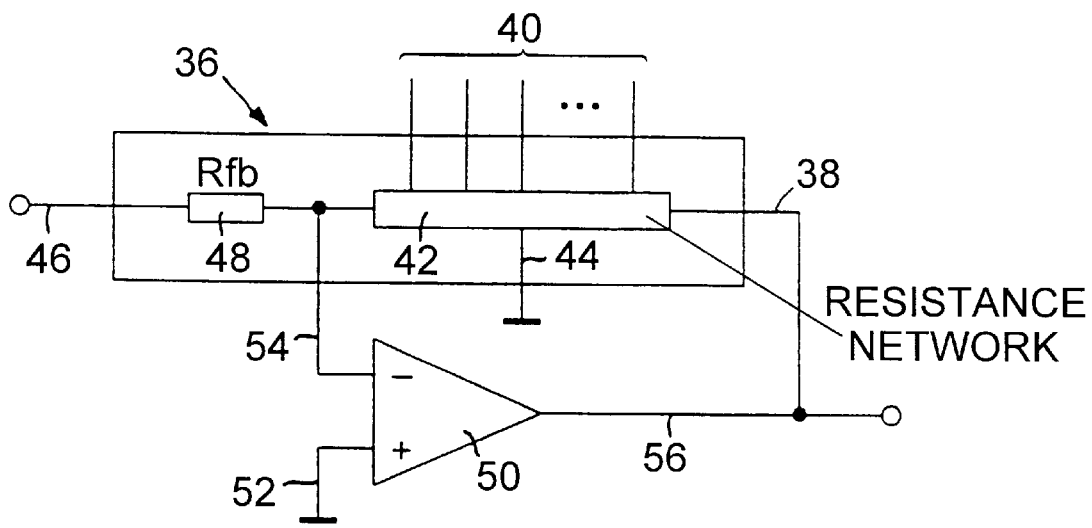
FIG. 5 is a block diagram of a second embodiment of an amplifier with a digitally adjustable gain factor, suitable for use in the tomography apparatus of the invention.

FIG. 5 shows a modified amplifier circuit in which the resistance network 42 and the resistor 48 are interchanged. If, in this circuit, all bits of the digital input 40 have the value "0," the current from the reference voltage terminal 38 flows completely via the ground terminal 44. In this circumstance, no negative feedback takes place between the amplifier input 56 and the inverting input 54, so that the gain factor between the terminal 46 serving as input and the amplifier output 56 is practically −∞. If all bits of the digital input 40 are logical "1," the gain factor is −1.

Figure 6:
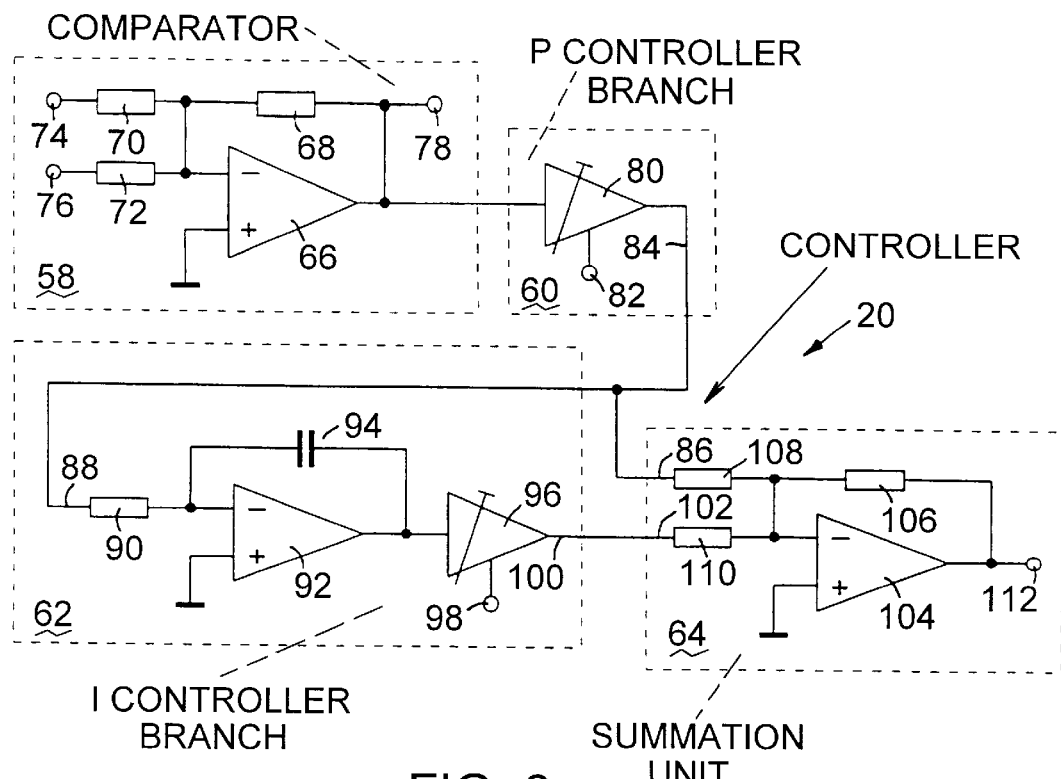
FIG. 6 is a circuit diagram of a control arrangement for the tomography apparatus of the invention.

The circuit of a control arrangement shown as an example in FIG. 6 includes a comparator 58 and the controller 20. The comparator 58 is set fixedly with regard to its signal transmission characteristics, whereas the transmission function of the controller 20 (and thereby the transmission function of the entire control means) can be varied by means of a digital control word. The controller 20 is a PI controller, and has a P controller branch 60 for the providing of a proportional portion, an I controller branch 62 for providing an integral portion, and a summation unit 64.

The comparator 58 is fashioned in a known way as an inverting summation amplifier including an operational amplifier 66, a feedback resistor 68 and two input resistors 70, 72. Two inputs 74, 76 are provided for the target value (cf. FIG. 3a) or for the negative actual value (cf. FIG. 3b). Since signals of different polarity are at these inputs 74, 76, the function of the comparator 58, i.e. the subtraction of the input values from one another, is effected here by means of a summation circuit.

The operational amplifier 66 adds the values at the inputs 76, 78, amplifies them by a negative factor that depends on the ratio of the resistors 68, 70, 72, and produces a corresponding signal at an output 78 that corresponds to the negative error signal (cf. FIG. 3d). Expressed mathematically, the value $(-K) \cdot (U_{soll} + (-U_{ist}))$ is present at to the output 78, whereby (−K) is the gain factor, $U_{soll}$ is the target value at the input 74, and $(-U_{ist})$ is the negative actual value at the input 76.

The negative error signal produced by the comparator 58 serves as an input value for the P controller branch 60, and indirectly also for the I controller branch 62. The P controller branch 60 is formed by an inverting adjustable amplifier 80 whose gain factor can be adjusted by the application of digital values to an adjusting input 82 that is a component of the control input 22 of the controller 20. The circuit shown in FIG. 5 is used as an adjustable amplifier 80, but of the twelve bits of the digital input 40 the five least significant bits are set fixedly to the value "1." The adjusting input 82 is connected to the seven most significant bits of the digital input 40. The gain factor is thereby adjustable between −1 and −128. The P portion of the controller 20, i.e. its gain, is determined by this gain factor.

An output 84 of the P controller branch 60 is connected with a first input 86 of the summation unit 64 and with an input 88 of the I controller branch 62.

The I controller branch 62 includes an RC amplifier of a known type and that operates in integrating fashion, with a constant integration time, this amplifier being formed by an input resistor 90, an operational amplifier 92 and a feedback capacitor 94. An adjustable amplifier 96 with an adjusting input 98 is connected downstream from this RC amplifier, the adjustable amplifier being constructed in the same way as the above-described adjustable amplifier 80 of the P controller branch 60. An output 100 of the I controller branch 62 is connected with a second input 102 of the summation unit 64.

The I portion of the controller 20, i.e. its reset time, is determined by the I controller branch 62, or, more precisely, by the adjustment of the amplifier 96. The reset time is defined as the time required, given an abruptly changing error signal on the basis of the I portion, to achieve an equally large change of the manipulated variable arising in the P portion. The RC amplifier of the I controller branch 62 determines the maximum value of the reset time that is reached given the smallest possible gain factor of the adjustable amplifier 96. Given an increase of this gain factor, the reset time is reduced, i.e., the I portion of the controller 20 increases.

The summation unit 64 serves for the summation of the P or I portions at the inputs 86, 102. Like the already-described comparator 58, the summation unit 64 is fashioned as an inverting summation amplifier with an operational amplifier 104, a feedback resistor 106 and two input resistors 108, 110. A controller signal corresponding to the inverting manipulated variable (cf. FIG. 3c) is at an output 112 of the summation unit 64. The adjusting inputs 82 and 98 together form the control input 22 of the controller 20, and of the overall control arrangement shown in FIG. 6.

In an alternative embodiment, not shown in the figures, a D controller branch, for the production of a D portion in the controller signal, is provided parallel to the P controller branch 60 and to the I controller branch 62, by means of which an adjustable PID controller results.

Figure 7:
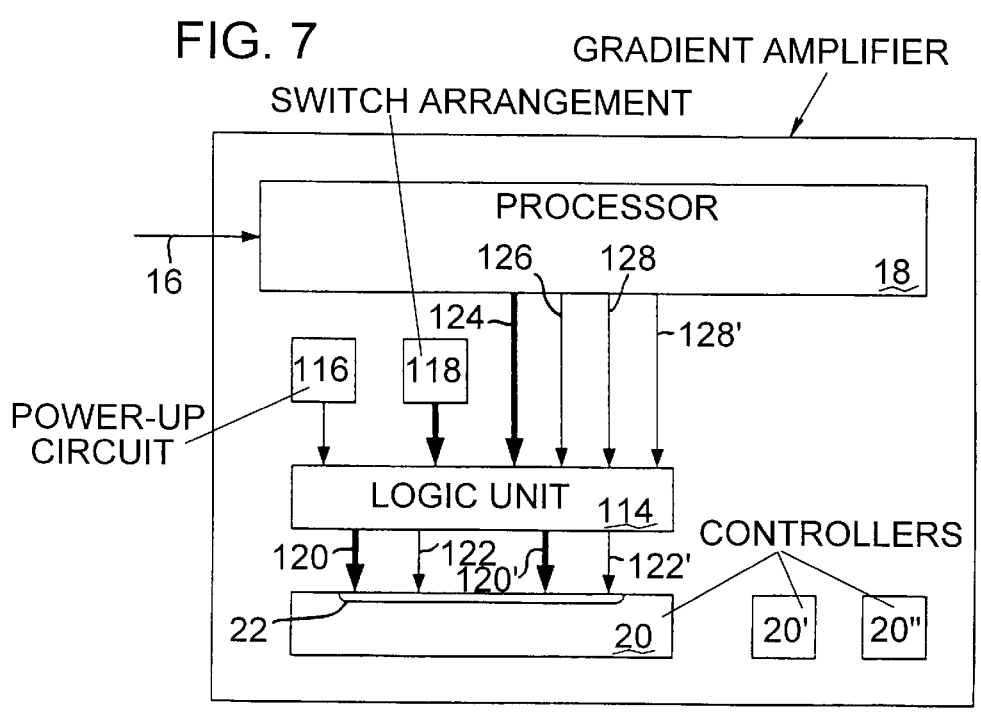
FIG. 7 is a block circuit diagram of a gradient amplifier in accordance with the principles of the present invention, in a further exemplary embodiment.

FIG. 7 illustrates, as an example, the transmission of control data within the gradient amplifier 12. Here a logic unit 114, a power-up circuit 116 and a switching arrangement 118 with 14 microswitches are structurally allocated to the controller 20. Two data lines 120, 120', each 7 bits wide, and two lines 122, 122', each for a write signal, run from the logic unit 114 to the control input 22 of the controller 20. The processor 18 and the logic unit 114 are connected via a 7-bit-wide data bus 124, an enable line 126 and two write lines 128,128'.

The data line 120 serves for the transmission of a first, 7-bit-wide component of the control word to the adjusting input 82 of the adjustable amplifier 80. The write line 122 is also connected to the amplifier 80. An active level on the write line 122 signals that valid control data are present on the data line 120, and can be accepted into a register (not shown in the figures) of the digital-to-analog converter 36 in the amplifier 80. Correspondingly, the data line 120' and the write line 122' serve for the transmission of a second, 7-bit-wide control word component to the adjusting input 98 of the amplifier 96.

When the system is turned on, the power-up circuit 116, formed by a resistor and a capacitor, emits a corresponding signal to the logic unit 114. This unit 114 thereupon takes a 14-bit-wide control word from the 14 microswitches of the switch arrangement 118 and transmits it, in the way described above, to the controller 20 via the lines 120, 120', 122, 122'. The control word preset at the microswitches corresponds to a controller setting that enables an uncritical operation with each gradient coil.

During the operation of the tomography apparatus, a controller setting command incoming via the communication connection 16 is decoded by the processor 18, and is allocated, for example, to the controller 20. The control word contained in the controller setting command comprises two components, each 7 bits wide, respectively for setting the P controller branch 60 and the I controller branch 62. The time diagram of FIG. 8 shows how these two components are transmitted to the logic unit 114 from the processor 18.

First the processor 18 sets the enable line 126 allocated to the controller 20 to logic "1" (signal "enable" in FIG. 8). The first component of the control word is now applied to the data bus 124 (signals "Data"). As soon as these data are stable, the processor 18 emits a write pulse to the first write line 128, allocated to the P controller branch 60 (signal "Write-P"). The transmission of the second control word component, which is allocated to the I controller branch 62, correspondingly ensues by the application of the data to the data bus 124 and the production of a write pulse on the second write line 128' (signal "Write-I"). The control word transmitted in this way to the logic unit 114 is forwarded to the controller 20 in the way described above.

The controllers 20', 20" are connected with the processor 18 via further logic units (not shown in FIG. 7). Each of these logic units has a separate enable line, the data bus 124 and the two write lines 128,128' being supplied in common to all the logic units. By means of this arrangement, only relatively few terminals are required at the processor 18, namely seven terminals for the data bus 124, two for the write lines 128, 128', and one for each enable line of each connected logic unit. For the transmission of data to one of the controllers 20, 20' and 20", the processor 18 drives only the enable line of that logic unit that is allocated to the controller 20, 20', 20" to be adjusted.

The further embodiment of the gradient amplifier 12 shown in FIG. 9 enables the controllers 20, 20', 20" to be independently calibrated (without support from the apparatus control 10 or an operating person) to a setting that is optimal for the connected gradient coils. For this purpose, the gradient amplifier 12 has a pulse generator 130 that is driven by the processor 18, the generator 130 enabling the production of test sequences of target value curves with different pulse shapes, amplitudes, etc. Via a changeover switch 132, likewise controlled by the processor 18, the test sequences, or normal operating sequences, can be optionally applied to the target value input 74 of the comparator 58 allocated to the controller 20. The operating sequences are applied to a sequence data input 134 by the system control 10 or by another suitable assembly as digital sequence data, and are converted into the analog target value signal by a digital-to-analog converter 136.

The error signal output 78 of the comparator 58 is connected to an evaluation circuit 138, in which the error signal, which serves as an answer-back signal, is rectified and filtered via a low-pass filter. The error signal evaluated in this way is digitized by an analog-to-digital converter 140 and is routed to the processor 18 for further processing. The evaluation circuit 138 is required only when the efficiency of the processor 18 is too low to process the actual non-evaluated error difference signal in real time. Given a very efficient processor 18, the output 78 can be connected directly to the analog-to-digital converter 140, which then operates like the converter assembly 32 shown in FIG. 2.

For the independent calibration of the controller 20, the processor 18 activates the pulse generator 130 and applies the signal thereof to the target value input 74 via the changeover switch 132. The processor 18 now sets the controller 20 to a very low gain of the P controller branch 60 and a very long reset time of the I controller branch 62. The processor 18 now increases the P portion, step-by-step at first. The evaluated error signal (the output signal of the evaluation circuit 138) becomes smaller at first, until the control circuit begins to oscillate and the evaluated error signal increases again. On the basis of the measurement data determined in this way, given a slow, constant adjustment of the I portion, the processor 18 defines a gain value for the P portion that lies below the "critical" gain.

The processor 18 now holds the optimized P portion constant and increases the I portion step-by-step (shortening of the reset time). Again, the evaluated error signal decreases at first and then increases again, from which the processor 18 determines an optimal setting for the I portion.

This calibration method is repeated with different test sequences. The controller setting determined as a final result can either be transmitted to the apparatus control 10 or can be stored in a data set memory 142 allocated to the processor 18. In the latter case, the processor 18 can independently change over the controller 20, given a change of the connected gradient coil, for which purpose, however, it requires information concerning the type of the coil. This information can be supplied to the processor 18 either via the communication connection 16 or via additional lines, not shown in FIG. 9.

The additional controllers 20', 20" of the gradient amplifier 12 are set in the same way. For this purpose, a further changeover switch (not shown in FIG. 9) is allocated to each of them, with the pulse generator 130, the evaluation circuit 138 and the analog-to-digital converter 140 being are used in common for the adjustment of all three controllers 20, 20', 20".

In a variant embodiment based on the circuit of FIG. 2, the calibration method described herein can also be carried out by the apparatus control 10, instead of by the processor 18. The converter assemblies 32, 32', 32" can be provided with a rectifier and a lowpass filter if warranted, in order to relieve the burden on the apparatus control 10 in the evaluation of the error signals in real time.

In an alternative embodiment, the controller 20 and/or the overall control arrangement can be a completely digital signal process.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient amplifier for a nuclear magnetic resonance tomography apparatus, said tomography apparatus comprising at least one gradient coil connectable to said gradient amplifier, said gradient amplifier comprising at least one feedback control device:

said feedback control device comprising:
a comparator for generating a control difference signal;
a controller being responsive to said control difference signal for generating a controller output signal; and
a control input;
said feedback control device implementing a transmission function which is selectable from a plurality of predetermined transmission functions by means of a digital control word applied to said control input.

2. A gradient amplifier as claimed in claim 1 wherein said controller comprises a P controller branch and an I controller branch.

3. A gradient amplifier as claimed in claim 1 wherein said digital control word comprises at least a portion coded as a binary number.

4. A gradient amplifier as claimed in claim 1 wherein said feedback control device further comprises at least one adjustable amplifier having a gain factor which influences said transmission function, said gain factor being adjusted by at least a portion of said digital control word.

5. A gradient amplifier as claimed in claim 4 wherein said portion of said digital control word is coded as a binary number, and wherein said adjustable amplifier comprises at least one multiplying digital-to-analog converter having a digital input to which said portion of said digital control word is supplied.

6. A gradient amplifier as claimed in claim 1 further comprising:
   at least one further feedback control device;
   a communication link for receiving a setting command; and
   a processing logic device connected to said communication link;
   said processing logic device extracting said digital control word from said setting command and allocating the extracted digital control word to one of said feedback control devices and feeding said digital control word to the control input of the allocated feedback control device.

7. A gradient amplifier as claimed in claim 1 further comprising a calibration unit for selecting one transmission function of said feedback control unit dependent on at least one answer-back signal.

8. A gradient amplifier as claimed in claim 7 wherein said calibration unit comprises a processor, a pulse generator and an evaluation unit.

9. A nuclear magnetic resonance tomography apparatus comprising:
   a gradient coil;
   a gradient amplifier connected to said gradient coil;
   said gradient amplifier comprising at least one feedback control device;
   said feedback control device comprising:
      a comparator for generating a control difference signal;
      a controller being responsive to said control difference signal for generating a controller output signal; and
      a control input;
   said feedback control device implementing a transmission function which is selectable from a plurality of predetermined transmission functions by means of a digital control word applied to said control input;
   said nuclear magnetic resonance tomography apparatus further comprising a control word source connected to said control input for generating said digital control word.

10. A nuclear magnetic resonance tomography apparatus as claimed in claim 9 wherein said control word source comprises a sensing unit for recognizing a type of gradient coil connected to said gradient amplifier and for determining said digital control word dependent on an output value of said sensing unit.

11. A nuclear magnetic resonance tomography apparatus as claimed in claim 9 further comprising a calibration unit for selecting said digital control word dependent on characteristics of said gradient coil.

12. A nuclear magnetic resonance tomography apparatus as claimed in claim 11 wherein said calibration unit comprises a processor and at least one converter unit responsive to an answer-back signal.

13. A nuclear magnetic resonance tomography apparatus as claimed in claim 12 wherein said controller comprises a P controller branch and an I controller branch, and wherein said calibration unit determines a first setting of said P controller branch and a subsequent setting of said I controller branch by an iterative approximation to a target characteristic of said answer-back signal.

14. A nuclear magnetic resonance tomography apparatus as claimed in claim 9 wherein said controller comprises a P controller branch and an I controller branch.

15. A nuclear magnetic resonance tomography apparatus as claimed in claim 9 wherein said digital control word comprises at least a portion coded as a binary number.

16. A nuclear magnetic resonance tomography apparatus as claimed in claim 9 wherein said feedback control device further comprises at least one adjustable amplifier having a gain factor which influences said transmission function, said gain factor being adjusted by at least a portion of said digital control word.

17. A nuclear magnetic resonance tomography apparatus as claimed in claim 16 wherein said portion of said digital control word is coded as a binary number, and wherein said adjustable amplifier comprises at least one multiplying digital-to-analog converter having a digital input to which said portion of said digital control word is supplied.

18. A nuclear magnetic resonance tomography apparatus as claimed in claim 9 further comprising:
   at least one further feedback control device;
   a communication link for receiving a setting command; and
   a processing logic device connected to said communication link;
   said processing logic device extracting said digital control word from said setting command and allocating the extracted digital control word to one of said feedback control devices and feeding said digital control word to the control input of the allocated feedback control device.

19. A nuclear magnetic resonance tomography apparatus as claimed in claim 9 further comprising a central apparatus control, and wherein said control word source is physically allocated to said central apparatus control.

20. A nuclear magnetic resonance tomography apparatus as claimed in claim 11 further comprising a central apparatus control, and wherein said calibration unit is physically allocated to said central apparatus control.

* * * * *